(12) United States Patent
Okada

(10) Patent No.: US 10,460,697 B2
(45) Date of Patent: Oct. 29, 2019

(54) CIRCUIT DEVICE INCLUDING COMPARATOR CIRCUIT WITH SWITCHING CIRCUIT FOR OFFSET PREVENTION

(71) Applicant: SEIKO EPSON CORPORATION, Tokyo (JP)

(72) Inventor: Shigeru Okada, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 147 days.

(21) Appl. No.: 15/699,351

(22) Filed: Sep. 8, 2017

(65) Prior Publication Data

US 2018/0076801 A1 Mar. 15, 2018

(30) Foreign Application Priority Data

Sep. 12, 2016 (JP) .................................. 2016-177569

(51) Int. Cl.
  *G09G 5/00* (2006.01)
  *H03K 5/003* (2006.01)
  *G09G 3/20* (2006.01)
  *H03K 5/24* (2006.01)

(52) U.S. Cl.
  CPC .......... *G09G 5/003* (2013.01); *G09G 3/2096* (2013.01); *H03K 5/003* (2013.01); *H03K 5/2481* (2013.01); *G09G 2310/0243* (2013.01); *G09G 2310/08* (2013.01); *G09G 2320/04* (2013.01); *G09G 2320/041* (2013.01); *G09G 2330/021* (2013.01); *G09G 2360/14* (2013.01)

(58) Field of Classification Search
  CPC .......... G09G 3/00–38; G09G 5/00–42; G09G 2320/04; G09G 2320/041; G09G 2320/043; G09G 2360/14–148; H03K 5/22–249
  See application file for complete search history.

(56) References Cited

U.S. PATENT DOCUMENTS

| 6,812,689 B2* | 11/2004 | Krause | G01R 19/003 324/762.02 |
| 7,652,508 B2* | 1/2010 | Maeda | G09G 3/3406 327/72 |
| 8,624,816 B2* | 1/2014 | Ryu | G09G 3/3688 345/100 |

(Continued)

FOREIGN PATENT DOCUMENTS

JP    2011-128219 A    6/2011

*Primary Examiner* — Gene W Lee
(74) *Attorney, Agent, or Firm* — Oliff PLC

(57) ABSTRACT

A circuit device 500 includes a comparator circuit CP and a switching circuit SW. The switching circuit SW supplies a detection voltage Vdet that is based on a result of detection from the environment sensor to a first input terminal Tin1 of the comparator circuit CP and a reference voltage Vref to a second input terminal Tin2 of the comparator circuit CP during a first period out of a detection period, and supplies the reference voltage Vref to the first input terminal Tin1 and the detection voltage Vdet to the second input terminal Tin2 during a second period out of the detection period. TB>TA is satisfied, where TA denotes a duration of the detection period, and TB denotes a duration of a period from an end of a first detection period to a start of a second detection period that is subsequent to the first detection period.

20 Claims, 9 Drawing Sheets

(56) References Cited

U.S. PATENT DOCUMENTS

| | | | | |
|---|---|---|---|---|
| 8,669,933 B2* | 3/2014 | Kunimori | ............ | G09G 3/3406 345/102 |
| 2006/0049855 A1* | 3/2006 | Ikeda | .................. | H03K 5/2481 327/77 |
| 2014/0253176 A1* | 9/2014 | O'Leary | .................. | H03K 5/22 327/77 |

* cited by examiner

CIRCUIT DEVICE INCLUDING COMPARATOR CIRCUIT WITH SWITCHING CIRCUIT FOR OFFSET PREVENTION

This application claims the benefit of Japanese Patent Application No. 2016-177569, filed on Sep. 12, 2016. The content of the aforementioned application is incorporated herein by reference in its entirety.

BACKGROUND

1. Technical Field

The present invention relates to a circuit device, an electro-optical device, and an electronic device, for example.

2. Related Art

In recent years, a circuit device to which a signal that is based on the result of detection is input from an environment sensor has been known. For example, a circuit device that performs processing to compare a signal from an environment sensor with a given reference signal can determine the relationship between the state of the surrounding environment and a given reference state based on the result of comparison.

For example, JP-A-2011-128219 discloses a display device that includes a temperature detector circuit that uses a comparator to compare a voltage that changes depending on the temperature with a reference voltage that corresponds to a given temperature. In the example discussed in JP-A-2011-128219, the environment sensor is a temperature sensor. JP-A-2011-128219 discloses an approach for detecting whether or not the temperature is greater than or equal to a set temperature using a temperature detector circuit, and when detecting an abnormality, controlling a source driver and a gate driver to eliminate the temperature abnormality.

When performing processing to compare a signal from an environment sensor with a given reference signal, the results is constant in most cases. In the example in which a high temperature abnormality is detected, the environment temperature is lower than the set temperature in most cases. As a result, the voltage level in the comparator circuit is at the same level in most cases, and the element will change over time (e.g. an offset will occur), which leads to degradation of comparison accuracy.

In view of this problem, it is expected that the voltage level can be prevented from being one-sided, and the offset can be improved by interchanging the two input signals to the compactor circuit (the signal from the environment sensor and the given reference signal) with each other as appropriate. When interchanging the input signals with each other, it is necessary to set the duration of a period (a detection period) in which two comparison operations, namely one before the interchange and one after the interchange, are performed, and the duration of a period between a given detection period and the subsequent detection period. There must be a desirable relationship between the durations of these periods, in terms of the reduction of the offset and the simplification of the configuration and the operations of the circuit device. However, the aforementioned related art does not disclose an approach for appropriately setting each of the periods.

SUMMARY

According to some aspects of the invention, it is possible to provide a circuit device, an electro-optical device, an electronic device, and so on that reduce the influence of an offset, and perform comparison processing with high accuracy based on a signal from an environment sensor.

One aspect of the invention relates to a circuit device that includes: a comparator circuit that has a first input terminal and a second input terminal, and compares a voltage that is supplied to the first input terminal with a voltage that is supplied to the second input terminal; and a switching circuit to which a detection voltage that is based on a result of detection from an environment sensor, and a reference voltage, are input, wherein the switching circuit supplies the detection voltage to the first input terminal of the comparator circuit and the reference voltage to the second input terminal of the comparator circuit during a first period out of a detection period, and supplies the reference voltage to the first input terminal and the detection voltage to the second input terminal during a second period out of the detection period, and TB>TA is satisfied, where TA denotes a duration of the detection period, and TB denotes a duration of a period from an end of a first detection period, which is the detection period, to a start of a second detection period, which is a detection period that is subsequent to the first detection period.

According to this aspect of the invention, the voltages that are input to the two input terminals of the comparator circuit are interchanged in the first period and in the second period, and TB>TA is satisfied, where TA denotes the duration of the detection periods and TB denotes the duration of a period that corresponds to the interval between the detection periods. With such a configuration, it is possible to prevent the voltage level in the comparator circuit from being one-sided, and prevent the element from changing over time (prevent an offset from occurring) by controlling the switching circuit. Furthermore, by setting TA and TB, it is possible to improve the offset prevention effect, and reduce the power consumption of the circuit device, for example.

It is also preferable that the comparator circuit is set to be in an inactive state or a low power consumption state during a third period between the first period and the second period, the low power consumption state being a state in which power consumption is lower than power consumption in the first period and the second period.

With such a configuration, it is possible to enable the comparator circuit to efficiently operate, and to improve the offset prevention effect and reduce the power consumption of the circuit device, for example.

It is also preferable that the switching circuit is set to be in a non-selected state during a third period between the first period and the second period, the non-selected state being a state in which the first input terminal and the second input terminal are not supplied with the detection voltage or the reference voltage.

With this configuration, it is possible to prevent the comparator circuit from being supplied with voltage during the third period.

It is also preferable that the comparator circuit is set to be in an inactive state or a low power consumption state during a fourth period that is the period from the end of the first detection period to the start of the second detection period, the low power consumption state being a state in which power consumption is lower than power consumption in the first period and the second period.

With such a configuration, it is possible to enable the comparator circuit to efficiently operate, and to improve the offset prevention effect and reduce the power consumption of the circuit device, for example.

It is also preferable that the switching circuit is set to be in a non-selected state during a fourth period that is the period from the end of the first detection period to the start of the second detection period, the non-selected state being a state in which the first input terminal and the second input terminal are not supplied with the detection voltage or the reference voltage.

With this configuration, it is possible to prevent the comparator circuit from being supplied with voltage during the fourth period.

It is also preferable that the comparator circuit is set to be in an active state during the first period and the second period, and in an inactive state or a low power consumption state during a period other than the first period or the second period, the low power consumption state being a state in which power consumption is lower than power consumption in the first period and the second period.

With such a configuration, it is possible to enable the comparator circuit to efficiently operate, and to improve the offset prevention effect and reduce the power consumption of the circuit device, for example.

It is also preferable that the circuit device further includes an output circuit that outputs a result of comparison by the comparator circuit, wherein the output circuit outputs the result of comparison obtained in one of the first period and the second period.

With such a configuration, it is possible to, for example, omit a circuit that inverts the signal level, and reduce the dimension of circuitry.

It is also preferable that, if the second period is set to be subsequent to the first period in the detection period, the output circuit outputs the result of comparison obtained in the second period.

With such a configuration, it is possible to, for example, produce an output when the output from the comparator circuit is stable.

It is also preferable that a duration of the first period is equal to a duration of the second period.

Such a configuration improves the symmetry of the voltages that are applied to the first input terminal and the second input terminal, and it is possible to improve the offset prevention effect.

It is also preferable that TB>2×TA is satisfied, where TA denotes the duration of the detection period and TB denotes the duration of the period from the end of the first detection period to the start of the second detection period.

With such a configuration, TA is sufficiently smaller than TB, and it is possible to improve the offset prevention effect and further reduce the power consumption of the circuit device.

It is also preferable that the circuit device further includes a driving circuit that drives an electro-optical panel, wherein the detection period is set based on a vertical synchronization signal that is used to drive the electro-optical panel, or an external command.

With such a configuration, it is possible to realize an efficient circuit configuration when the circuit device is applied to a display driver or the like.

It is also preferable that the first period and the second period are set based on a pixel clock signal that is used to drive the electro-optical panel.

With such a configuration, it is possible to realize an efficient circuit configuration when the circuit device is applied to a display driver or the like.

Another aspect of the invention relates to a circuit device that includes: a switching circuit to which a detection voltage that is based on a result of detection from an environment sensor, and a reference voltage, are input; and a comparator circuit that has a first input terminal and a second input terminal, and compares a voltage that is supplied to the first input terminal with a voltage that is supplied to the second input terminal, wherein the switching circuit supplies the detection voltage to the first input terminal and the reference voltage to the second input terminal during a first comparison period, supplies the reference voltage to the first input terminal and the detection voltage to the second input terminal during a second comparison period that is subsequent to an end of the first comparison period, supplies one of the detection voltage and the reference voltage to the first input terminal and the other of the detection voltage and the reference voltage to the second input terminal during a third comparison period that is subsequent to an end of the second comparison period, and a period from a start of the first comparison period to the end of the second comparison period is shorter than a period from the end of the second comparison period to a start of the third comparison period.

According to this aspect of the invention, the voltages that are input to the two input terminals of the comparator circuit are interchanged in the first comparison period and in the second comparison period. With such a configuration, it is possible to prevent the voltage level in the comparator circuit from being one-sided, and prevent the element from changing over time (prevent an offset from occurring) by controlling the switching circuit. Furthermore, it is also possible to improve the offset prevention effect and reduce the power consumption of the circuit device, for example, by setting the period from the start of the first comparison period to the end of the second comparison period, and the period from the end of the second comparison period to the start of the third comparison period.

Another aspect of the invention relates to an electro-optical device that includes the above-described circuit device and the electro-optical panel.

Another aspect of the invention relates to an electronic device that includes the above-described circuit device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
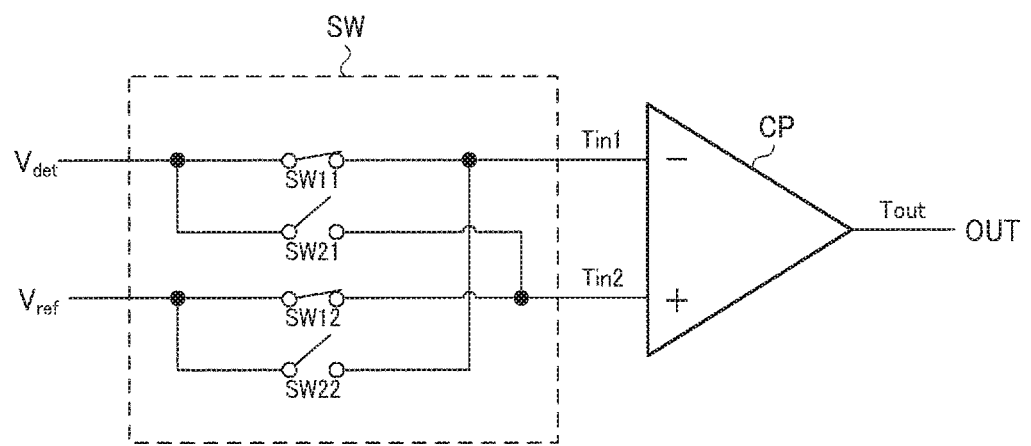
FIG. 1 is an example of a basic configuration of a circuit device.

The following describes preferable embodiments of the invention in detail. Note that the following embodiment is not intended to unreasonably limit the content of the invention that is described in the claims, and not all configurations that are described in the present embodiment are necessarily essential as solving means of the invention.

1. Approach According to Present Embodiment

First, an approach according to the present embodiment will be described. There is a widely known circuit device that performs environment sensing by performing processing to compare a signal from an environment sensor with a given reference signal. The environment sensor here is a sensor that performs surrounding environment sensing, and various kinds of sensors may be employed. For example, the environment sensor may be a temperature sensor that detects an ambient temperature, an atmospheric pressure sensor that detects an atmospheric pressure, an illuminance sensor that detects an illuminance, or another sensor.

In some cases, such a circuit device uses a signal that serves as a threshold value for abnormality determination as a given reference signal. For example, as disclosed in JP-A-2011-128219, a signal that corresponds to a temperature that is set for high temperature abnormality detection, which is relatively high, is used to perform processing for comparison with a signal that is based on the environment sensor. In this case, a high temperature abnormality should not occur (is unlikely to occur), and therefore "Environment Temperature<Set Temperature" is satisfied in many cases. For example, if a detection voltage Vdet (an environment dependent voltage or a temperature dependent voltage) has a negative correlation with the temperature as in FIG. 3 described later, a reference voltage Vref that corresponds to Vdet and the set temperature satisfies Vdet>Vref in many cases.

If a connection state in which Vdet is input to one of two input terminals of a comparator circuit and Vref is input to the other is fixed, the Vdet side input terminal will always be supplied with a voltage that is higher than the voltage that is supplied to the Vref side input terminal. As a result, the voltage level in the comparator circuit is always one-sided, and the element will change over time (an offset will occur).

The comparator circuit has a differential pair as described later with reference to FIG. 5, and the differential pair have two transistors (Tr1 and Tr2) whose gates are connected to the input terminals. In a MOS transistor, for example, carriers (hot carriers) that have very high energy due to acceleration by voltage are injected into a gate oxide film, and a phenomenon in which the carriers are trapped as floating charges occurs. Due to the carriers being trapped, for example, a threshold voltage Vth rises, and the abilities of the circuit degrade.

As described above, if the voltage level in the comparator circuit is one-sided in most cases, one and the other of the transistors that are included in the differential pair have a significant difference in the degree of degradation (the amount of deviation of the threshold voltage Vth from an ideal value). As a result, the comparison accuracy of the comparator circuit degrades. Specifically, although it is ideal if the result of comparison switches when the detection voltage Vdet and the reference voltage Vref are equal, there will be the risk of the result of comparison switching when Vdet≠Vref is satisfied and the result of comparison not matching the magnitude relationship between Vdet and Vref.

In contrast, as shown in FIG. 1, a circuit device 500 according to the present embodiment has a first input terminal Tin1 and a second input terminal Tin2, and includes: a comparator circuit CP that compares a voltage that is supplied to the first input terminal Tin1 with a voltage that is supplied to the second input terminal Tin2; and a switching circuit SW to which a detection voltage Vdet that is based on the detection result from the environment sensor and a reference voltage Vref are input. During a first period in a detection period, the switching circuit SW supplies the detection voltage Vdet to the first input terminal Tin1 of the comparator circuit CP, and supplies the reference voltage Vref to the second input terminal Tin2 of the comparator circuit CP. During a second period in a detection period, the switching circuit SW supplies the reference voltage Vref to the first input terminal Tin1, and supplies the detection voltage Vdet to the second input terminal Tin2. A first detection period corresponds to A5 in FIG. 6 described later, and a second detection period corresponds to A6 in FIG. 6. The first period corresponds to A1 in FIG. 6, and the second period corresponds to A2 in FIG. 6.

Figure 2:
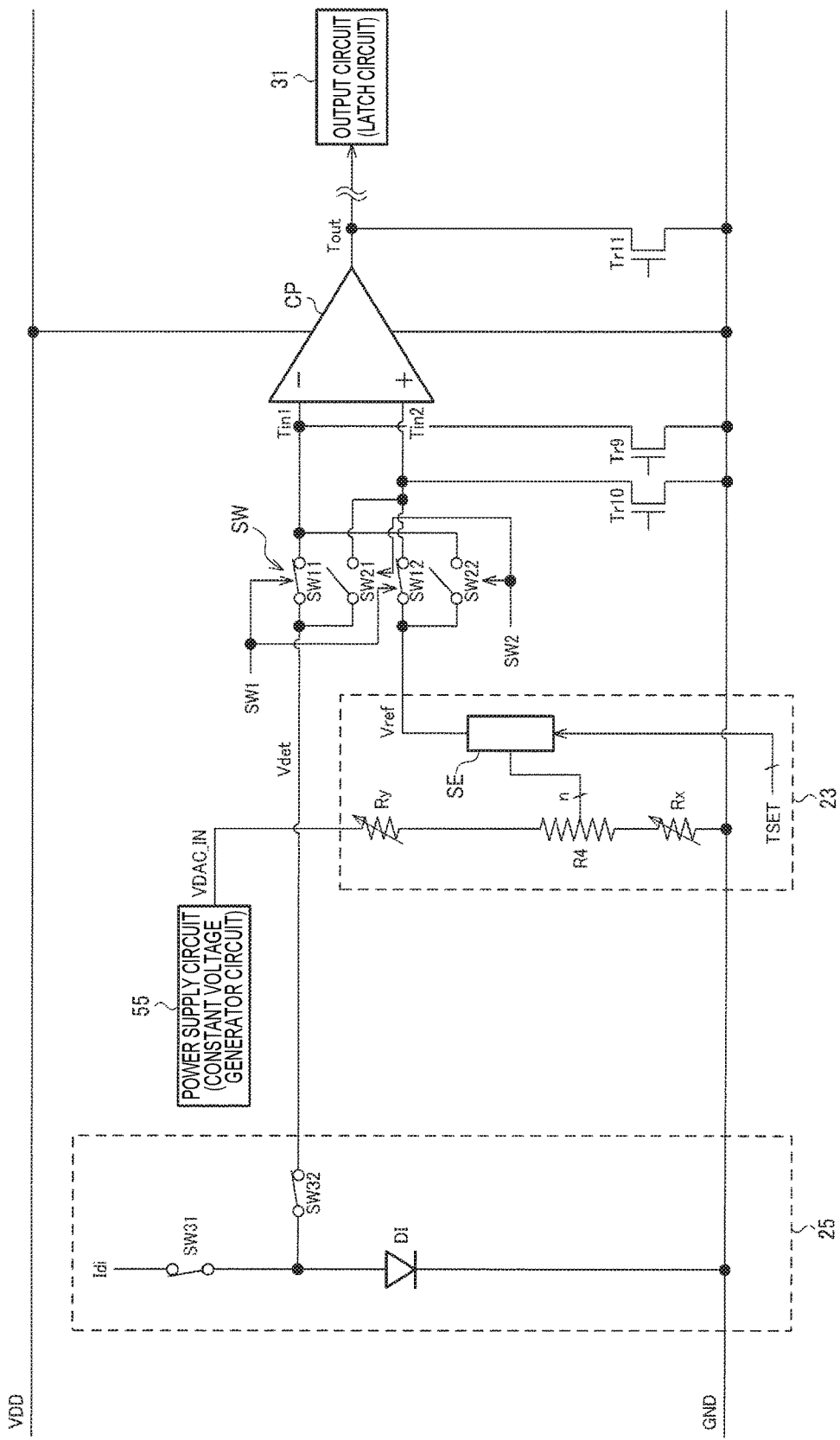
FIG. 2 is an example of a detailed configuration of the circuit device.

The environment sensor here can be realized using various kinds of sensors for environment sensing. The environment sensor may be provided inside the circuit device 500 as shown in FIG. 2, or outside the circuit device 500.

The detection period is a unit period for which one result of comparison is calculated based on the detection voltage Vdet, and includes at least the first period and the second period. The detection period is a period that includes a first period, a second period, and a third period, as specifically described below with reference to FIG. 6.

Figure 3:
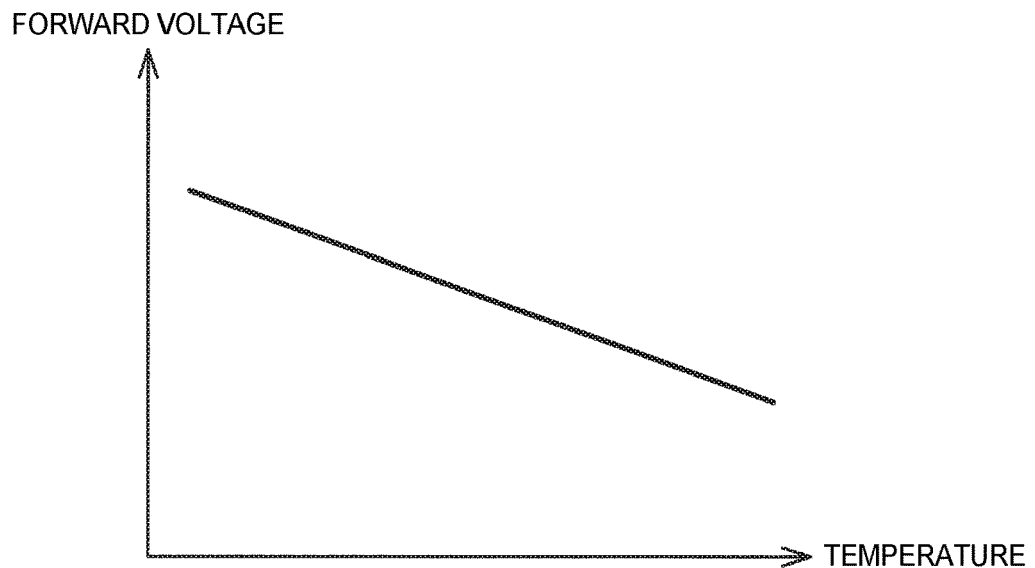
FIG. 3 is an example of temperature characteristics of a diode.

One of the first input terminal Tin1 and the second input terminal Tin2 of the comparator circuit CP is an inverting input terminal, and the other is a non-inverting input terminal. The following describes an example in which the first input terminal Tin1 is an inverting input terminal and is connected to the gate of Tr1 in FIG. 5, and the second input terminal Tin2 is a non-inverting input terminal and is connected to Tr2 in FIG. 5. Therefore, in a situation where Vref<Vdet is satisfied (if a temperature sensor with the characteristics shown in FIG. 3 is used, this situation corresponds to when a high temperature abnormality is not detected), the result of comparison is at the low level during the first period, and at the high level during the second period. However, it is possible that the first input terminal is a non-inverting input terminal and the second input terminal is an inverting input terminal.

With the above-described configuration, it is possible to switch the connection state in the first period and in the second period. The switching circuit SW may include four switches SW11, SW12, SW21, and SW22 as shown in FIG. 1, for example. During the first period, the switches SW11 and SW12 are ON and the switches SW21 and SW22 are OFF. In the second period, the switches SW21 and SW22 are ON and the switches SW11 and SW12 are OFF. As a result, in the entirety of a single detection period, Vref and Vdet are supplied to each of the two input terminals (the gates of the two transistors included in the differential pair). That is, it is possible to prevent the voltage level from being one-sided, and to prevent an offset from occurring, and perform comparison processing with high accuracy.

Figure 11:
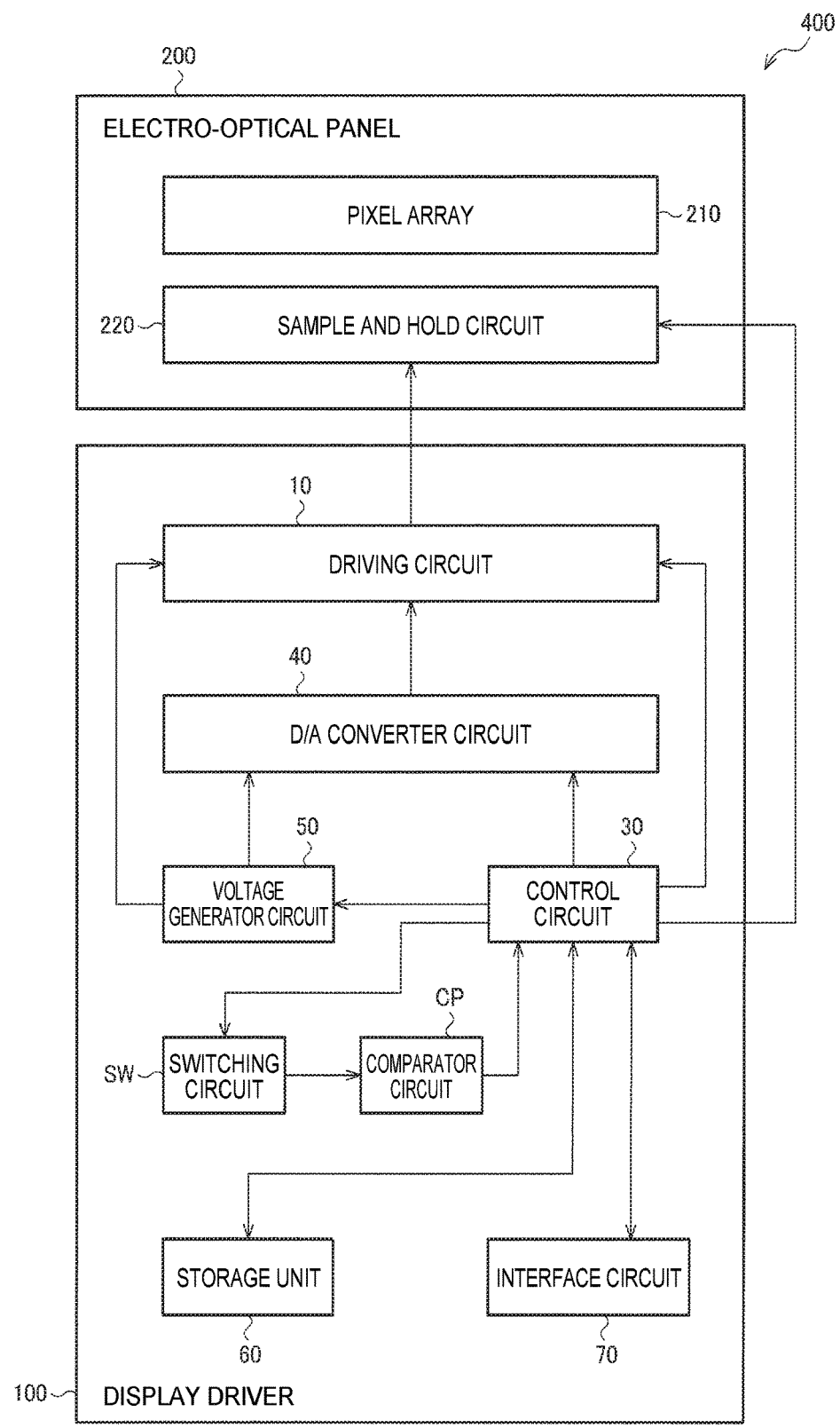
FIG. 11 is an example of a configuration of an electro-optical device.

Here, it is unlikely that the surrounding environment suddenly changes in a short period. In the example of a temperature sensor, the temperature under a natural environment changes at the rate of about 0.28° C./sec, for example. In the case of detecting the temperature of an electro-optical panel as shown in FIG. 11, it is necessary to take into consideration heat that is generated by a backlight (such as an LED). However, even in such a case, the change will not be extremely large. That is, even if the rate at which the result of comparison is output (the rate at which comparison processing is performed) is extremely high, the possibility of the result of comparison changing between adjacent time points is low, and there is not much merit in outputting the result of comparison at a high frequency. On the contrary, there can be demerits such as an increase in power consumption and faster deterioration of the element due to Vref and Vdet being supplied to the comparator circuit CP for a longer period. Various values can be taken as a specific value of the output rate. For example, as described below, the result of comparison may be output once in every period that is in the range of several tens of milliseconds to 1 second.

It is preferable that the time interval between the first period and the second period, i.e. if the first period precedes the second period in terms of time, for example, the period from the end of the first period to the start of the second period, is short. As described below, when the result of comparison is output in one of the first period and the second period (the second period in this example), the result of comparison that is obtained in the period in which the result of comparison is not output (the first period in this example) does not affect the output, and therefore it seems not to matter when the period starts or when the period ends. However, since the first period is a period that is set to prevent the voltage level from being one-sided, it is important that the first period is symmetrical to the second period in terms of the voltage level.

If a change from the environment information in the first period to the environment information in the second period is large, there is the risk of the voltage level not being inverted despite the connection state being inverted. For example, there is a case in which Vdet>Vref is satisfied in the first period, Vdet decreases until the second period, and Vdet<Vref is satisfied in the second period. In this example, a voltage that is higher than the voltage that is supplied to the second input terminal Tin2 is supplied to the first input terminal Tin1 in both the first period and the second period, and thus the offset reduction effect degrades.

As described above, considering the operational efficiency of the circuit device 500, a period that is sufficiently long to allow a certain change to occur is set to the interval between outputs. Therefore, depending on the setting of the first period and the second period, there is an undeniable possibility of the environment significantly changing in the interval between these two periods. For example, in a case where the comparison result is output once every one second, if the interval between the first period and the second period is set to be constant, the interval between the first period and the second period is approximately 500 msec. There is the possibility of the environment information such as the temperature changing in the period of 500 msec by a certain amount, and, as described above, there is the risk of the relationship between Vdet and Vref being opposite in the first period and in the second period. In contrast, if the interval between the first period and the second period (the period from the end of one of the periods to the start of the other) is set to be short, the environmental change can be suppressed, and therefore the symmetry of the first period and the second period can be improved.

Considering the above-described points, the present embodiment satisfies TB>TA, where TA denotes the duration of a detection period, and TB denotes the duration of a period from the end of the first detection period, which is a detection period, to the start of the second detection period, which is the detection period that is subsequent to the first detection period. As a result, the interval between detection periods is relatively long, and it is possible to efficiently perform environment sensing. Also, the durations of detection periods are short, and the time interval between the first period and the second period is short. Therefore, it is possible to appropriately reduce an offset. In the example below, TA+TB is in the range of several tens of milliseconds to 1 second, whereas TA is several tens of microseconds. Therefore, TB>TA is satisfied.

The following describes an example of a detailed configuration of the circuit device 500 with reference to FIGS. 2 to 5, and examples of operations of the circuit device 500 with reference to FIGS. 6 to 10. Thereafter, an electro-optical device 400 and an electronic device 300 that each include the circuit device 500 according to the present embodiment will be described. Although the following describes an example in which a temperature sensor is used, the environment sensor may be another sensor as described above.

2. Example of Configuration of Circuit Device

FIG. 2 is an example of a detailed configuration of the circuit device 500 according to the present embodiment. The circuit device 500 includes the comparator circuit CP, the switching circuit SW, a power supply circuit 55 (a constant voltage generator circuit), a reference voltage generator circuit 23, and a detection voltage generator circuit 25 (an environment sensor). However, the circuit device 500 is not limited to the configuration in FIG. 2, and may be variously modified by, for example, omitting one or more of the constituent elements, or adding another constituent element. Also, the configurations of the components of the circuit device 500 are not limited to those shown in FIG. 2, and may be variously modified.

The detection voltage generator circuit 25 generates the detection voltage Vdet that is dependent on the environment temperature. The power supply circuit 55 and the reference voltage generator circuit 23 generate the reference voltage Vref that corresponds to a given set temperature. The following describes each component in detail.

The detection voltage generator circuit 25 includes a diode DI, a switches SW31 and SW32. A given reference current Idi is supplied to one end of the switch SW31, and the diode DI is provided between the other end of the switch SW31 and a low potential-side power supply voltage VSS. Specifically, one end of the SW31, which is opposite the end to which Idi is supplied, is connected to the anode of the diode DI, and VSS is supplied to the cathode of the diode DI. Note that the following describes an example in which the low potential-side power supply voltage VSS is at a ground GND level.

Upon the temperature sensor being activated, the switches SW31 and SW32 are turned ON, and the constant current Idi flows through the diode DI as a forward current. The constant current Idi is supplied from a constant current source, which is not shown. Here, it is known that forward voltage across the diode DI (voltage across the terminals) changes depending on the temperature.

FIG. 3 shows a relationship between the forward voltage across the diode DI and the temperature when a forward current that has a given current value flows. In FIG. 3, the horizontal axis indicates the temperature and the vertical axis indicates the forward voltage. As shown in FIG. 3, the forward voltage across the diode DI generally has negative temperature characteristics, i.e., the forward voltage decreases as the temperature rises. That is, upon being supplied with the constant current Idi, the detection voltage generator circuit 25 can output a voltage that is dependent on an environment temperature Te as the detection voltage Vdet.

Note that although FIG. 2 shows an example of a configuration in which the diode DI is used as the detection voltage generator circuit 25 (a temperature sensor), such a configuration is not essential. Various configurations of a temperature sensor, such as a configuration in which a resistor is employed, are widely known, and such configurations are widely applicable to the detection voltage generator circuit 25 according to the present embodiment. Instead of defining the voltage across the terminals of the diode DI as the detection voltage Vdet, it is possible to define a voltage resulting from voltage conversion (voltage step-up or voltage step-down) on the voltage across the terminals as the detection voltage Vdet. If this is the case, a voltage converter circuit (not shown) is to be added between the anode of the diode DI and the switch SW32, or between the switch SW32 and the switching circuit SW.

The power supply circuit 55 is a circuit that supplies a given constant voltage VDAC_IN. Various configurations are known as configurations of a circuit that generates a constant voltage, and these configurations are widely applicable to the power supply circuit 55. The voltage VDAC_IN is used to generate the reference voltage Vref with which a comparison is performed by the comparator circuit CP.

Note that the voltage generated by the power supply circuit 55 may be used for a purpose other than the generation of the reference voltage Vref. For example, the voltage generated by the power supply circuit 55 may be used to operate other circuits in the circuit device 500. If the circuit device 500 is included in a display driver 100, the power supply circuit 55 may be used to operate a driving circuit 10 that drives an electro-optical panel 200. The reference voltage generator circuit 23 and the detection voltage generator circuit 25 in FIG. 2 are circuit blocks that operate upon the temperature sensor being activated, whereas the power supply circuit 55 in this case is a circuit that is always operating regardless of whether or not the temperature sensor has been activated. The power supply circuit 55 is a circuit that starts operating upon the circuit device 500 being activated, for example.

Figure 4:
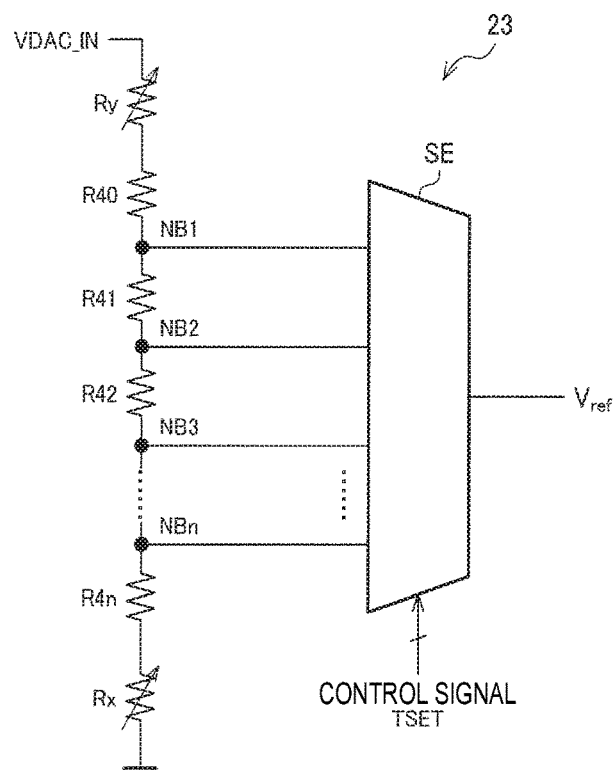
FIG. 4 is an example of a configuration of a reference voltage generator circuit.

The reference voltage generator circuit 23 generates the reference voltage Vref that corresponds to a given set temperature, based on the voltage VDAC_IN supplied from the power supply circuit 55, and outputs the generated Vref to the switching circuit SW. For example, if the detection voltage Vdet output from the detection voltage generator circuit 25 has the characteristics shown in FIG. 3, the reference voltage generator circuit 23 outputs a voltage that matches the characteristics. Specifically, if the set temperature is Tref, the reference voltage generator circuit 23 outputs, as the reference voltage Vref, a voltage that is determined based on Tref and the straight line shown in FIG. 3. As a result, it becomes possible to compare the set temperature Tref with the environment temperature Te by comparing the reference voltage Vref with the detection voltage Vdet. As shown in FIG. 4, the reference voltage generator circuit 23 may include resistors Rx, R4 (R40 to R4n), and Ry that are provided between the terminal to which the voltage VDAC_IN is supplied from the power supply circuit 55, and the ground GND. The reference voltage generator circuit 23 outputs a fraction of the voltage VDAC_IN, which has been produced using the resistors Rx, R4, and Ry, as the reference voltage Vref. Although the set temperature Tref may be fixed to one temperature, this is not essential, and may be selected from among a plurality of temperatures.

FIG. 4 is an example of a detailed configuration of the reference voltage generator circuit 23. The reference voltage generator circuit 23 includes the resistors Rx, R40 to R4n, and Ry that are provided in series between the terminal to which the voltage VDAC_IN is supplied from the power supply circuit 55, and the ground GND. Voltage dividing nodes NB1 to NBn provided using the resistors R40 to R4n are connected to n input terminals of a selector SE. A voltage dividing node NBi is a connection node between a resistor R4i-1 and a resistor R4i. Here, i is an integer in the range of 1 to n, and n is an integer that is greater than or equal to 2. If the voltage at the voltage dividing node NBi is Vrefi, n voltages Vref1 to Vrefn are input to the selector SE. The selector SE selects one of the voltages Vref1 to Vrefn based on a control signal TSET that is used to determine the set temperature, and outputs the selected voltage to the switching circuit SW as the reference voltage Vref.

As a result, it is possible to select the set temperature Tref from n candidates, and to flexibly perform temperature detection. Specific resistance values of the resistors Rx, R40 to R4n, and Ry may be set based on the candidate values of the set temperature Tref and the characteristics of the detection voltage generator circuit 25 (e.g. FIG. 3). Note that FIG. 2 shows a configuration in which the reference voltage generator circuit 23 includes the resistors Rx, R40 to R4n, and Ry. However, the configuration of the reference voltage generator circuit 23 is not limited to such a configuration, and a component other than a resistor may be used as long as the configuration will not be temperature dependent.

As described above, the reference voltage Vref and the detection voltage Vdet are input to the switching circuit SW, using the power supply circuit 55, the reference voltage generator circuit 23, and the detection voltage generator circuit 25. As described with reference to FIG. 1, the switching circuit SW includes the switches SW11, SW12, SW21, and SW22. An example of control performed on each switch will be described later with reference to FIG. 6 and so on.

Figure 5:
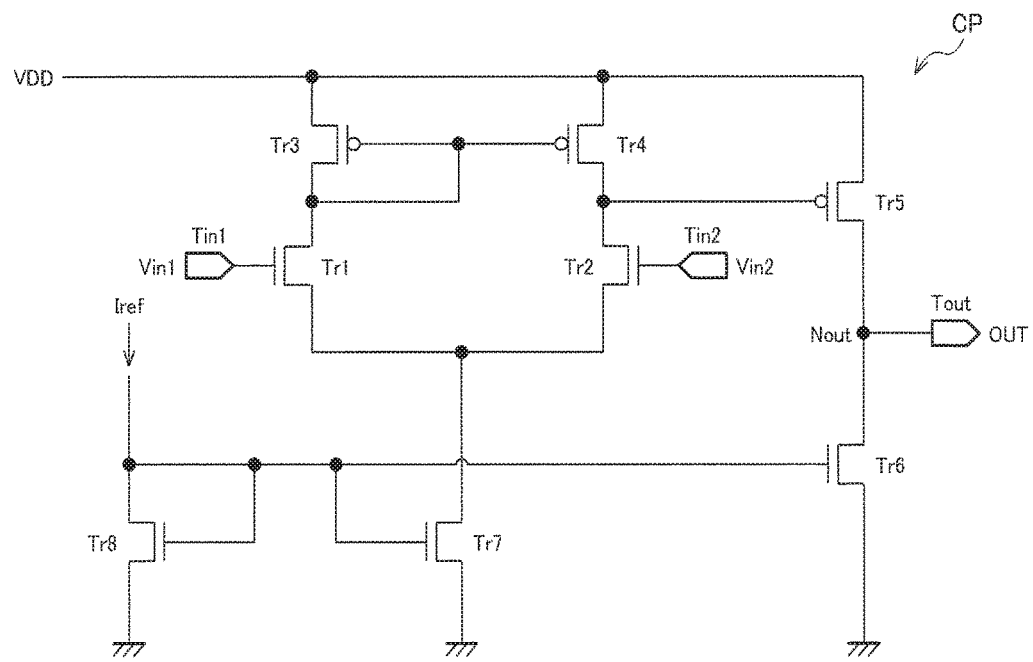
FIG. 5 is an example of a configuration of a comparator circuit.

FIG. 5 is an example of a configuration of the comparator circuit CP. The comparator circuit CP includes transistors Tr1, Tr2, Tr6, Tr7, and Tr8 of an N-type (a first conductivity type in a broader definition), and transistors Tr3, Tr4, and Tr5 of a P-type (a second conductivity type in a broader definition). The transistors Tr1 and Tr2 are input transistors, and two input signals (Vref and Vdet) are input to the gate of each of these transistors. That is, the first input terminal Tin1 and the second input terminal Tin2 of the comparator circuit CP correspond to the terminal that is connected to the gate of the transistor Tr1 and the terminal that is connected to the gate of the transistor Tr2. The transistors Tr1 and Tr2 constitute a differential pair.

The transistors Tr3 and Tr4 constitute a current mirror, and the connection node between the transistors Tr4 and Tr2 is connected to the gate of the transistor Tr5. The transistors Tr5 and Tr6 are grounded source circuit at the output stage, and a node Nout between the transistors Tr5 and Tr6 is connected to an output terminal Tout that outputs an output signal OUT.

The transistors Tr8 and Tr7 constitute a current mirror circuit, and a current that corresponds to Iref flows to the current source transistor Tr7. The transistors Tr8 and Tr6 constitute a current mirror circuit, and a current that corresponds to Iref flows to the current source transistor Tr6.

Vin1 denotes a voltage that is input to the first input terminal Tin1, and Vin2 denotes a voltage that is input to the second input terminal Tin2. If Vin2>Vin1 is satisfied, the current flowing through Tr2 increases, the voltage at the node of the gate of Tr5 falls, Tr5 is turned ON, and OUT rises to the high level. If Vin2<Vin1 is satisfied, the current flowing through Tr2 decreases, the voltage at the node of the gate of Tr5 rises, Tr5 is turned OFF, and OUT falls to the low level. As described above, with the configuration shown in FIG. 5, the comparator circuit CP outputs two comparison results that depend on the magnitude of the input signal, as the output signal OUT. However, the configuration of the comparator circuit CP is not limited to that shown in FIG. 5, and comparator circuits (comparators) that have a different configuration are broadly applicable.

In FIG. 2, the comparator circuit CP outputs the output signal OUT to an output circuit 31. The output circuit 31 is, for example, a latch circuit, and the latch circuit is provided in, for example, a control circuit 30 that is shown in FIG. 11. The circuit device 500 may include a waveform shaping circuit, a voltage converter circuit (a voltage step-down circuit), or the like in the stage preceding the latch circuit. The operation timing of the output circuit 31 (the timing of latching a signal that is based on the output signal OUT) will be described below with reference to FIG. 6 and so on.

In addition, as shown in FIG. 2, transistors Tr9 to Tr11 may be respectively provided between the first input terminal Tin1, the second input terminal Tin2, and the output terminal Tout of the comparator circuit CP and the ground GND. The transistors Tr9 to Tr11 are OFF when the comparator circuit CP is in an active state, and are ON when the comparator circuit CP is in an inactive state. As a result, when the comparator circuit CP is in an inactive state, the first input terminal Tin1, the second input terminal Tin2, and the output terminal Tout are discharged, and thus appropriate operations are realized.

3. Examples of Operations of Circuit Device

Next, examples of operations of the circuit device 500 will be described with reference to the timing charts shown in FIGS. 6 to 10. First, examples of basic operations will be described with reference to FIG. 6. Then, the relationship with display control signals (such as a vertical synchronization signal VSYNC) in a case where the circuit device 500 is included in a display driver will be described with reference to FIGS. 7 and 8. Then, modification examples of the operations of the circuit device 500 will be described with reference to FIGS. 9 and 10.

3.1 Basic Operations of Circuit Device

Figure 6:
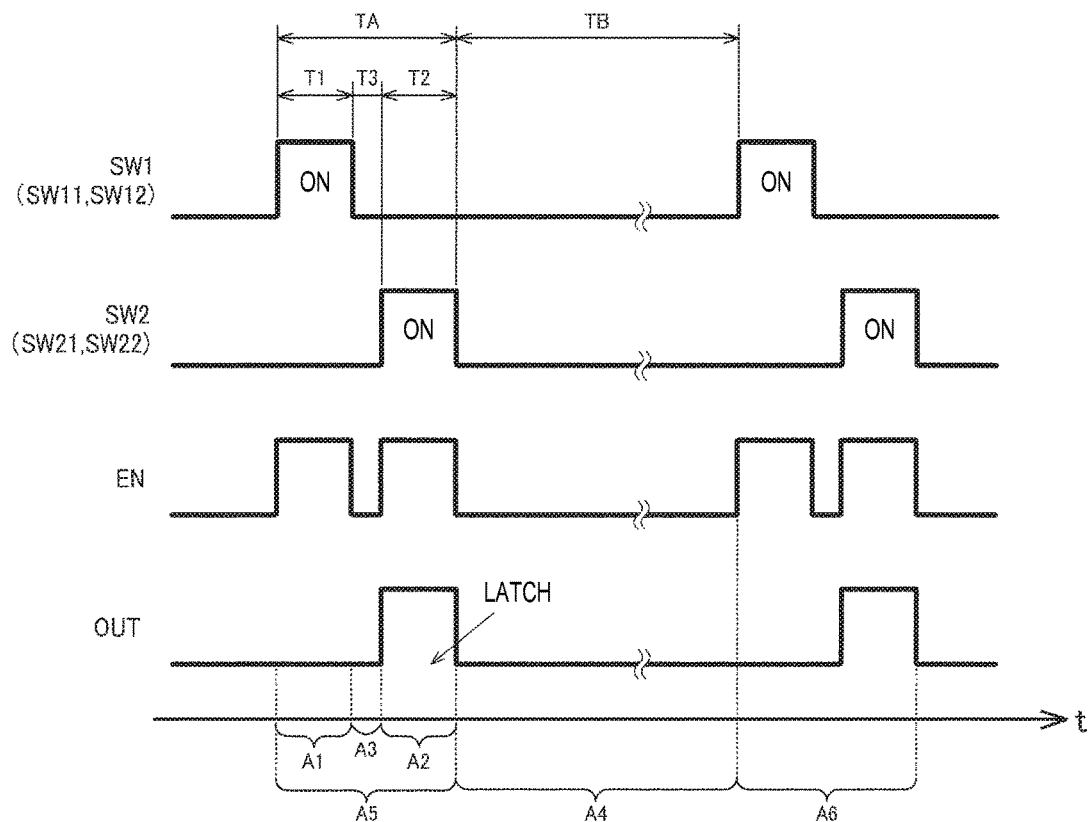
FIG. 6 is a timing chart illustrating operations of the circuit device.

FIG. 6 is a timing chart (a signal waveform diagram) showing the operations of the circuit device 500. SW1 denotes a control signal that controls the switches SW11 and SW12 that are included in the switching circuit SW. In the example shown in FIG. 6, the switches SW11 and SW12 are ON in periods in which SW1 is at the high level, and are OFF in periods in which SW1 is at the low level. Similarly, SW2 denotes a control signal that controls the switches SW21 and SW22, and the switches SW21 and SW22 are ON in periods in which SW2 is at the high level, and are OFF in periods in which SW2 is at the low level.

When the set of switches SW11 and SW12 or the set of switches SW21 and SW22 is ON, the other set is OFF, and these sets cannot be ON at the same time. In contrast, the set of switches SW11 and SW12 and the set of switches SW21 and SW22 are allowed to be OFF at the same time. A period in which SW1 is at the high level (and SW2 is at the low level) is the first period, and a period in which SW2 is at the high level (and SW1 is at the low level) is the second period.

As shown in FIG. 6, the switching circuit SW first turns SW11 and SW12 ON and SW21 and SW22 OFF, thereby supplying Vdet to the first input terminal Tin1 and Vref to the second input terminal Tin2 (A1). Furthermore, the switching circuit SW turns all of the switches SW11, SW12, SW21, and SW22 (A3) OFF, and thereafter turns SW11 and SW12 OFF and SW21 and SW22 ON, thereby supplying Vref to the first input terminal Tin1 and Vdet to the second input terminal Tin2 (A2). By performing A1 to A3, it is possible to prevent the voltage levels of the differential pair (Tr1 and Tr2) of the comparator circuit CP from being one-sided. A1 is the first period, A2 is the second period, and the period A3 therebetween is referred to as the third period.

The detection period according to the present embodiment is composed of the first to third periods, for example. That is, the duration TA of the detection period is T1+T2+T3, where T1 to T3 respectively denote the durations of the first to third periods.

Also, in the present embodiment, a period (A4) from the end of a given detection period (the first detection period, A5 in FIG. 6) to the start of the next detection period (the second detection period, A6) is referred to as a fourth period. The duration of the fourth period is TB as described above, and TB>TA is satisfied. TA+TB represents the period of an output cycle of the result of comparison, and is set based on the vertical synchronization signal VSYNC that will be described later with reference to FIG. 7, for example.

Here, considering the offset reduction effect, it is important that the voltage that is supplied to the comparator circuit CP in the first period is symmetrical to the voltage that is supplied to the comparator circuit CP in the second period. Therefore, even if the input signals are replaced by the switching circuit SW, it is not preferable if the durations of the periods are different because the voltage level will become one-sided due to the difference between the durations.

Therefore, in the present embodiment, it is preferable that the duration T1 of the first period and the duration T2 of the second period are the same. Such a configuration prevents the voltage level from being one-sided, and makes it possible to appropriately reduce the offset. However, T1 and T2 are not necessarily exactly the same, and need only be substantially the same. For example, T1 and T2 need only satisfy the condition that the difference between T1 and T2 falls within the range of a given threshold ±δ1, or the condition that the ratio of each one of the T1 and T2 to the other falls within the range of 1±δ2. For example, T1 and T2 are set to approximately 30 μsec.

As shown in FIG. 6, the switching circuit SW is set to be in a non-selected state during the fourth period between the end of the first detection period and the start of the second detection period. The non-selected state mentioned here is a state in which neither the detection voltage Vdet nor the reference voltage Vref is supplied to the comparator circuit CP. In the examples shown in FIGS. 1 and 2, the inactive state corresponds to a state in which all of the switches SW11, SW12, SW21, and SW22 are OFF. With this configuration, the switching circuit SW need only perform switching in the first to third periods out of the first to fourth periods, and a non-selected state is kept in the fourth period that is a relatively long period. That is, the switching circuit SW performs switching at a low frequency, and it is easy to perform control.

EN in FIG. 6 is a signal that represents the operations of the comparator circuit CP (a control signal for the comparator circuit CP). When EN is at the high level, the comparator circuit CP is set to be in an active state, and when EN is at the low level, the comparator circuit CP is set to be in an inactive state or a low power consumption state.

As shown in FIG. 6, the comparator circuit CP is set to be in an inactive state or a low power consumption state during the fourth period between the end of the first detection period and the start of the second detection period. As a result, the comparator circuit CP is not in the active state during the fourth period that is a relatively long period out of the first to fourth periods that correspond to an output cycle of the result of comparison, and therefore power consumption can be reduced. Furthermore, in an inactive state and a low power consumption state, it is possible to reduce the voltages that are input to the differential pair (reduce the voltages to 0 in a narrower sense), and therefore it is possible to prevent the element from degrading, and enhance the offset reduction effect.

Here, the inactive state of the comparator circuit CP represents a period in which a power supply voltage VDD and the reference current (a bias current) Iref are not supplied to the comparator circuit CP. Also, when the comparator circuit CP is in an inactive state, the above-described transistors Tr9 to Tr11 for discharging may be turned ON to discharge the first and second input terminals Tin1 and Tin2 and the output terminal Tout. A low power consumption state is a state in which, although at least one of the power supply voltage VDD and the reference current Iref is continuously supplied, the amount of supply (the voltage value and the current value) is smaller than that in an active state. In other words, a low power consumption state is a state in which power consumption is lower than that in the first period and the second period.

Also, as indicated by A3 in FIG. 6, the switching circuit SW is set to be in a non-selected state during the third period between the first period and the second period. As a result, the switching circuit SW does not supply voltage to the comparator circuit CP in the third period, and therefore it is possible to appropriately perform transition from the first period to the second period. For example, it is possible to prevent an inappropriate state, such as a state in which all of the switches SW11, SW12, SW21, and SW22 are ON, from occurring. The duration T3 of the third period may be variously set, and may be set to approximately 15 μsec, for example.

As indicated by EN in FIG. 6, the comparator circuit CP may be set to be in an inactive state or a low power consumption state during the third period between the first period and the second period. When the switching circuit SW is in a non-selected state, the switching circuit SW does not supply the detection voltage Vdet and the reference voltage Vref to the comparator circuit CP. However, if the comparator circuit CP is in an active state, there remains the possibility of, for example, the element degrading in the third period. For example, there is the possibility of the charge accumulated during the period preceding the third period (the first period in the example shown in FIG. 6) not being discharged, and the comparator circuit CP operating (the element degrading) due to the charge.

In contrast, if the comparator circuit CP is set to be in an inactive state or a low power consumption state during the third period as shown in FIG. 6, the comparator circuit CP can be prevented from operating in a period in which the comparator circuit CP does not need to operate, and the element can be prevented from changing (degrading) over time. The control signal EN for the comparator circuit CP shown in FIG. 6 can be generated by, for example, performing a logical disjunction (an OR operation) using SW1 and SW2, which are control signals for the switching circuit SW.

Furthermore, the comparator circuit CP may be set to be in an active state during the first period and the second period, and in an inactive state or a low power consumption state during a period other than the first period or the second period. As a result, the comparator circuit CP is in an active state only in a period in which the comparator circuit CP needs to operate, and therefore it is possible to efficiently prevent power consumption from increasing and the element from degrading.

As shown in FIG. 2, the circuit device 500 includes the output circuit 31 that outputs the result of comparison performed by the comparator circuit CP. As shown in FIG. 6, the output circuit 31 may output the result of comparison obtained in one of the first period and the second period. Although FIG. 6 shows an example in which the result of comparison obtained in the second period is output (latched), the result of comparison obtained in the first period may be output.

In the present embodiment, the duration TA of the detection period is set to be relatively short, and thus the time interval between the first period and the second period is set to be short. As a result, as indicated by the output signal OUT in FIG. 6, it is expected that the result of comparison obtained in the first period and the result of comparison obtained in the second period are in an inversion relationship. If the circuit device 500 includes a circuit that inverts the result of comparison, the output circuit 31 can output a desired signal in both the first period and the second period. However, if this is the case, there is the demerit of the dimension of circuitry increasing due to the circuit for inversion. In this regard, if the circuit device 500 is configured such that the result of comparison obtained in one of the first period and the second period is output, it is unnecessary to provide a circuit for inversion, and it is possible to prevent the dimension of circuitry from increasing.

FIG. 6 shows an example in which the output signal OUT is at the high level during the second period and at the low level during the first period. However, a person skilled in the art should easily understand that the output signal OUT varies according to the relationship between the detection voltage Vdet and the reference voltage Vref, the setting of the first and second input terminals, and so on.

The circuit device 500 according to the present embodiment may output a signal that is based on the result of output from the output circuit 31 to an external device (a host, such as a processing unit 310 in FIG. 12) via an interface circuit 70. The external device performs processing based on the received signal. In the example of the electronic device 300 that includes the electro-optical panel 200 described below, the processing unit 310 performs control to limit the amount of current that is supplied to a backlight of the electro-optical panel 200 upon receiving a signal that indicates a detection abnormality. As a result, it is possible to reduce that amount of heat that is generated by the electro-optical panel 200.

In this regard, an output from an interface (a terminal) of the circuit device 500 can be realized in various modes. For example, a terminal of the circuit device 500 may be set to be in a high impedance state (Hi-Z) if no abnormality has been detected, and set to a first logical level if an abnormality has been detected. The first logical level is, for example, a low level, but may be a high level. Alternatively, if the circuit device 500 is included in the display driver 100, the output may be changed depending on the state in which an image is displayed, so that the terminal is set to be in the high impedance state during a period in which no image is displayed.

If an abnormality has been detected, control that corresponds to the detected abnormality may be performed in the circuit device 500. For example, if the circuit device 500 is included in the display driver 100, a control may be performed to turn OFF (black out) the electro-optical panel 200 that is displaying an image.

3.2 Relationship with Image Display Control Signal

Figure 7:
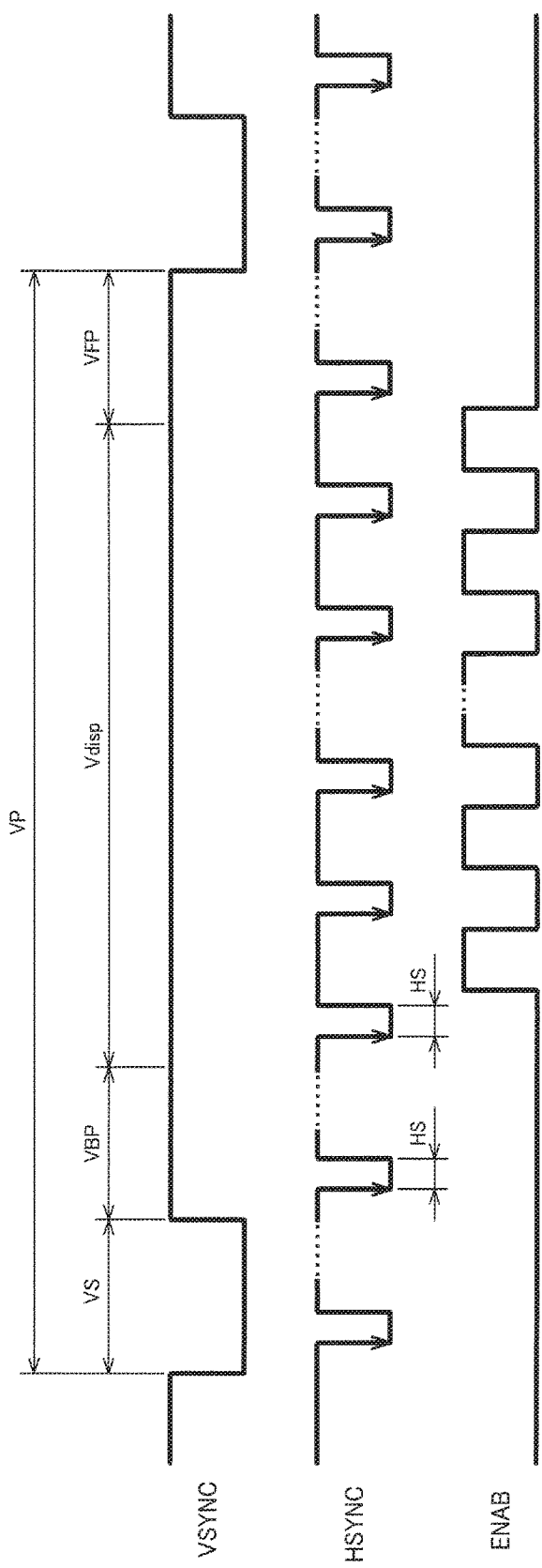
FIG. 7 is a timing chart illustrating image display operations.
Figure 8:
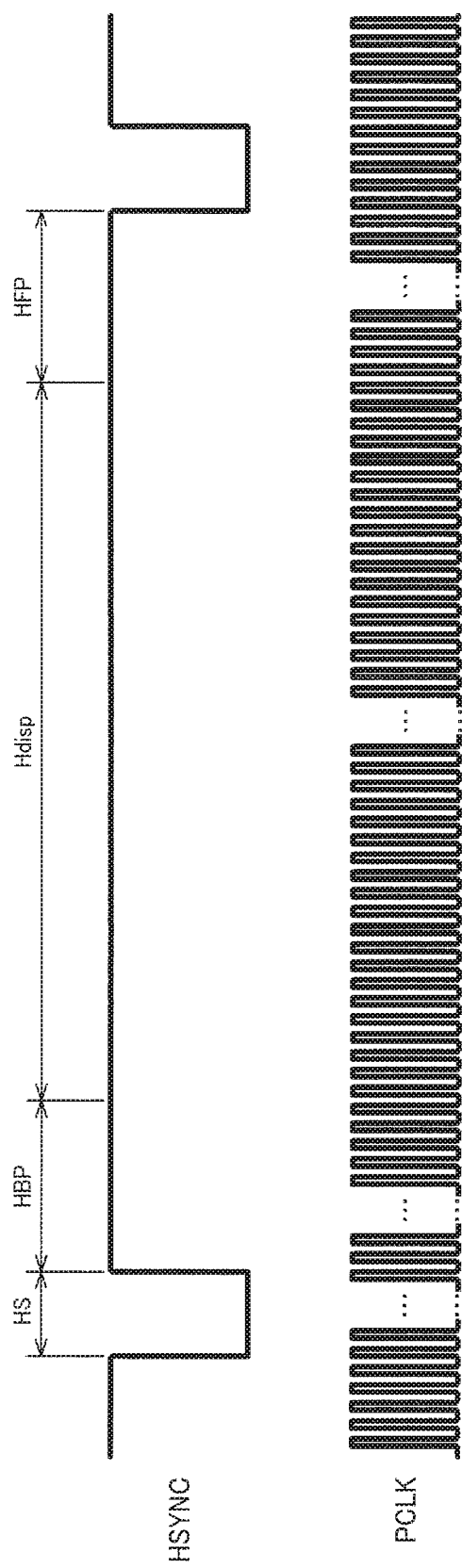
FIG. 8 is a timing chart illustrating image display operations.

The circuit device 500 according to the present embodiment may be included in the display driver 100 that drives the electro-optical panel 200. FIGS. 7 and 8 are timing charts (waveform diagrams) of image display control signals that are used in the display driver 100. The vertical synchronization signal VSYNC, a horizontal synchronization signal HSYNC, an enable signal ENAB, and a pixel clock signal (dot clock signal) PCLK are used to display images on the electro-optical panel 200.

The pixel clock signal PCLK is a signal that corresponds to one pixel (one dot) of the electro-optical panel 200. Scanning is performed for each pixel in a direction from the top left to the right bottom of the screen according to PCLK, and thus data signals (data voltages that are based on display data) for one screen are output. The horizontal synchronization signal HSYNC is a signal that represents one line in the horizontal direction. As shown in FIG. 8, in the period of one cycle of HSYNC, PCLK falls (rises) a number of times that corresponds to the number of pixels in the horizontal direction.

The vertical synchronization signal VSYNC is a signal that has a period that corresponds to one image (one frame). In the period of one cycle of VSYNC, HSYNC falls a number of times that corresponds to the number of pixels in the vertical direction (including a vertical front porch and a vertical back porch).

The enable signal ENAB is a signal that indicates a period for which data signals (e.g. gradation voltages that are respectively generated based on 8-bit display data for R, G, and B) are to be output.

As shown in FIG. 7, VP, which is the period of one cycle of the vertical synchronization signal VSYNC, corresponds to one frame. For example, as described above, 64×VP is approximately one second, and one frame is $\frac{1}{64}$ of one second. The vertical synchronization signal VSYNC is at the low level during a period VS in which vertical synchronization is performed, and is at the high level until synchronization is performed next time. The period in which VSYNC is at the high level can be divided into a vertical back porch period VBP, a vertical display period Vdisp, and a vertical front porch period VFP.

The horizontal synchronization signal HSYNC is at the low level during a period HS in which horizontal synchronization is performed, and is at the high level until horizontal synchronization is performed next time. It is possible to specify which horizontal line in the panel is scanned by counting the number of times horizontal synchronization has been performed since horizontal synchronization was performed in the period VS in which vertical synchronization is performed.

Data signals are output in periods that are each included in both Vdisp and a period between given two periods HS. To be exact, a period between the end of a given HS and the start of the next HS includes a horizontal back porch period HBP, a horizontal display period Hdisp, and a horizontal front porch period HFP as shown in FIG. 8, and data signals are output in periods that are each included in both Vdisp and Hdisp. Therefore, the enable signal ENAB is, as shown in FIG. 7, set to the high level during periods that are each included in both Vdisp and Hdisp, and to the low level during other periods.

Although it is possible to perform control for the switching circuit SW and control for the comparator circuit CP shown in FIG. 6 based on a dedicated clock signal, it is also possible to use the image display control signal shown in FIG. 7. Specifically, as described below with reference to FIG. 11, the circuit device 500 includes the driving circuit 10 that drives the electro-optical panel 200, and the detection periods (A5 and A6 in FIG. 6) are set based on the vertical synchronization signal VSYNC that is used to drive the electro-optical panel 200.

The display driver 100 needs to use the vertical synchronization signal VSYNC to drive the electro-optical panel 200. That is, if the vertical synchronization signal VSYNC is also used to set the detection periods, it is unnecessary to separately generate (acquire) signals for setting the detection periods. Therefore, it is unnecessary to provide a circuit for generating control signals, or an interface for acquiring control signals, and it is possible to simplify the circuit configuration.

For example, a detection period is set once every m frames. If m=64, a detection period is set once every approximately one second. If this is the case, the number of frames is counted by first resetting the counter (e.g. the count value=0) upon a detection period being set (started), and then incrementing the counter upon the vertical synchronization signal VSYNC falling (or rising). Then, upon the count value reaches a value that corresponds to m (e.g. the count value=63), the next detection period is started and the counter is reset again. As a result, it is possible to set a detection period once every m frames.

It is also possible to set m=1 and set a detection period at the frequency of once every one frame. If this is the case, it is unnecessary to provide a counter, and one detection period is set every time vertical synchronization is performed once. Note that the timing of starting a detection period in the period VP corresponding to one frame may be variously modified. For example, a detection period is set in the vertical front porch period VFP that is a period that is subsequent to the completion of the output of data signals for one frame. As described above, it is possible to specify the vertical front porch period VFP based on VSYNC and HSYNC, and therefore it is possible to set detection periods based on VSYNC and HSYNC.

Also, in the case of using VSYNC to set detection periods, it is possible to apply a modification in which no detection periods are set until a period corresponding to predetermined number of frames elapses after the activation of the temperature sensor. In order to perform comparison processing with high accuracy using the comparator circuit CP, it is important that the reference voltage Vref and the reference current Iref that is supplied to the comparator circuit CP are stable at desired values. Vref and Iref may be unstable in a period immediately after the activation of the temperature sensor. Therefore, it is possible to prevent the comparison accuracy of the comparator circuit CP from degrading by not setting a detection period in the aforementioned period. Note that the temperature sensor is activated based on a command from a host (the processing unit 310 in FIG. 12), for example.

The detection periods may be set based on the horizontal synchronization signal HSYNC instead of the vertical synchronization signal VSYNC. However, as can be seen from FIGS. 7 and 8, HSYNC is a clock that is faster than VSYNC. If detection is performed every time HSYNC falls (or rises), the number of detection periods will be excessive. Therefore, the number of times HSYNC rises, for example, is counted using a counter, and a detection period is set every m' rising edges of HSYNC. Preferably, m' here is greater than the aforementioned m.

Also, detection periods may be set based on an external command (a signal when a command is issued, in a narrower sense). In the above-described example, the initial detection period is set based on the timing of activating the temperature sensor, and detection periods are set based on a command for activating the temperature sensor. Also, as described below, it is possible to apply a modification in which the temperature sensor performs detection only upon receiving a command. If this is the case, it is also possible to apply a modification in which detection periods are set based on the command (the command for activating the temperature sensor), and VSYNC and HSYNC are not used. Also, although a command for activating the temperature sensor is shown as an example of a command, nothing hinders the use of other commands for the purpose of setting detection periods.

The first period and the second period may be set based on the pixel clock signal PCLK that is used to drive the electro-optical panel 200. Specifically, the pixel clock signal PCLK is used to generate the clock signals (SW1 and SW2) for the switching circuit SW in FIG. 6. As described above with reference to FIGS. 7 and 8, the pixel clock signal PCLK is a very fast clock signal (with a high frequency), and therefore it is possible to control the switching circuit SW at a high speed by using PCLK. When controlling the switching circuit SW, it is possible to use the pixel clock signal PCLK as it is, or a clock signal that is based on PCLK (e.g. a signal obtained by dividing PCLK). In this regard, the circuit device 500 may include a dividing circuit that divides PCLK, or acquire a clock signal divided by an external device outside the circuit device 500, via the interface circuit 70.

As can be seen from the description above, a detection period is set at the frequency of once every m frames. The period corresponding to m frames varies depending on the value of m and the frame rate, but is at least of the order of several tens of milliseconds, and the duration of a detection period, which is of the order of several tens of microseconds, is sufficiently shorter than the period corresponding to m frames. That is, TA is sufficiently smaller than TA+TB, where TA denotes the duration of a detection period, and TB denotes the duration of a period (the fourth period) from the end of the first detection period to the start of the second detection period. For example, TA and TB satisfy TB>2×TA. However, the coefficient on the right side is not limited to 2, and may be a greater value. In a broader sense, a relationship TA<<TB is satisfied.

Detection periods are set using VSYNC and HSYNC, and an example in which detection periods are successively (periodically) set has been described above. That is, in the example above, it is assumed that temperature abnormality detection is successively performed after the activation of the temperature sensor. However, it is possible to perform temperature abnormality detection using the temperature sensor only when a command from a host is received, instead of always performing temperature abnormality detection. As a result, the operating frequency of the reference voltage generator circuit 23, the detection voltage generator circuit 25, and the comparator circuit CP in FIG. 2 decreases, which leads to power saving. Also, the frequency at which voltage is supplied to the comparator circuit CP also decreases, which prevents the comparator circuit CP from degrading.

The command is, as described above, an activation command for the temperature sensor from the host. Upon receiving an input command, the circuit device 500 (the control circuit 30 in a narrower sense) performs a detection operation for a predetermined period using the temperature sensor, and ends the detection operation upon the predetermined period elapsing. After ending the detection operation, the circuit device 500 may transit to a command receiving state, and perform a detection operation for a predetermined period again upon receiving an input command.

In this case, as described above, detection periods are set based on external commands. For example, the circuit device 500 sets a detection period upon a predetermined period elapsing after the circuit device 500 has received a command signal. The predetermined period here is used to stabilize the reference voltage Vref and the reference current Iref. As described above, the predetermined period may be measured using VSYNC. However, in this example, it is unnecessary to periodically perform a detection operation, and therefore it is possible to set detection periods without using VSYNC. For example, a signal other than VSYNC (e.g. an internal clock or the like of the circuit device 500) may be used to measure the above-described predetermined period. As a result, it is possible to prevent the comparator circuit CP from degrading over time even if detection periods are not periodically set.

3.3 Modifications

Figure 9:
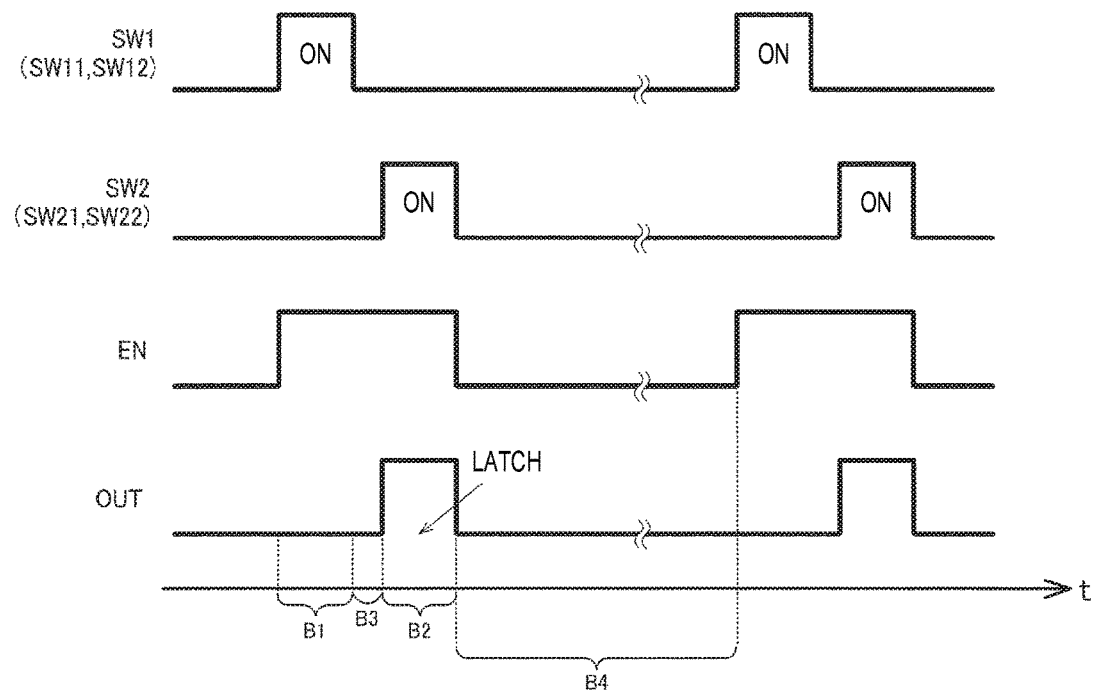
FIG. 9 is another timing chart illustrating operations of the circuit device.

FIG. 9 is a timing chart according to a first modification. As shown in FIG. 9, the comparator circuit CP may be set to be in an active state during the first to third periods (B1 to B3), and in an inactive state or a low power consumption state during the fourth period (B4). That is, during the third period between the first period and the second period, the comparator circuit CP may be set to be in an inactive state or a low power consumption state as shown in FIG. 6, or in an active state as shown in FIG. 9.

Considering degradation of the element of the comparator circuit CP over time as described above, FIG. 6 is preferable compared to FIG. 9. However, in the example shown in FIG. 9, the comparator circuit CP keeps the active state in the third period. Therefore, in the period that is subsequent to the third period (the second period in FIG. 9), the output from the comparator circuit CP is stable, and it is possible to prevent the output signal OUT from being output before changing to a desired value by outputting (latching) the result of comparison obtained in this period.

That is, if the second period is subsequent to the first period, it is preferable that the output circuit 31 output the result of comparison obtained in the second period. As a result, it is possible to output the result of comparison with high accuracy.

Figure 10:
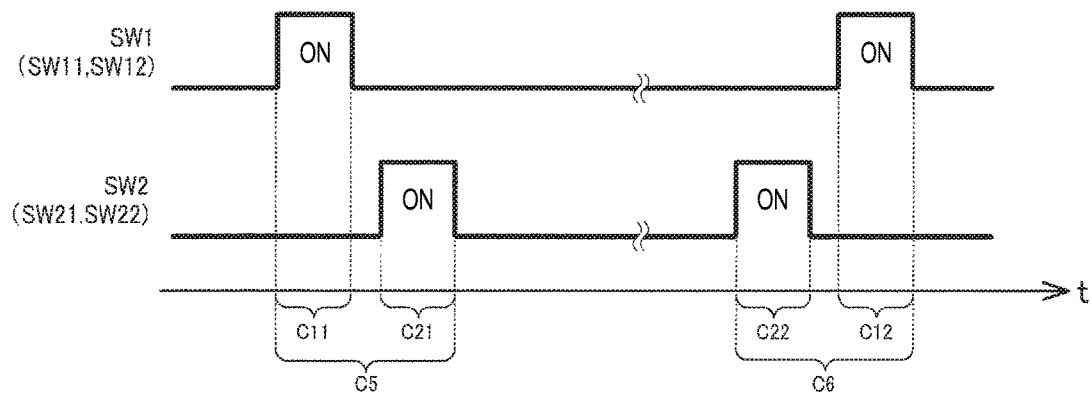
FIG. 10 is another timing chart illustrating operations of the circuit device.

FIG. 10 is a timing chart according to a second modification. As shown in FIG. 10, in a detection period, the first period does not necessarily precede the second period, and it is possible that the second period precedes the first period. Also, as shown in FIG. 10, the order in which the first period and the second period are arranged in each detection period is not necessarily fixed. In the example shown in FIG. 10, the first period (C11) precedes the second period (C21) in terms of time in the first detection period (C5), and the second period (C22) precedes the first period (C12) in terms of time in the second detection period (C6).

In this way, a detection period according to the present embodiment may be a period from the start of the first period to the end of the second period, or a period from the start of the second period to the end of the first period. Also, the first period and the second period may be rearranged for each detection period, and thus the setting of each period may be variously modified.

However, in the example shown in FIG. 10, it is necessary to change the timing of performing latching, or perform arithmetic processing based on the results of comparison. For example, in the case where latching is performed in the first periods (C11 and C12), latching in the first detection period (C5) is to be performed in the first half of the detection period, and latching in the second detection period (C6) is to be performed in the second half of the detection period. That is, if the result of comparison obtained in the first period is to be output, it is necessary to perform control to change the timing of performing latching in the detection periods. The same applies to the case where the result of comparison obtained in the second period is output.

Alternatively, it is possible to output the result of comparison obtained in a later (or earlier) period in a detection period. For example, the result of comparison obtained in the second period (C21) is output in the first detection period (C5), and the result of comparison obtained in the first period (C12) is output in the second detection period (C6). As a result, it becomes unnecessary to change the timing of performing latching. However, the terminals to which the reference voltage Vref and the detection voltage Vdet are input are inverted in the first period and in the second period. Therefore, it is necessary to perform arithmetic processing (to perform inversion using an inverter) based on the result of comparison obtained in either one of the aforementioned periods.

Considering this point, the approaches shown in FIGS. 6 and 9 are more advantageous than the approach shown in FIG. 10 in that it is unnecessary to change the timing of performing latching or performing arithmetic processing based on the results of comparison.

The above-described approaches according to the above described embodiment (and modifications) can also be put as follows. That is, the circuit device 500 has the switching circuit SW to which the detection voltage Vdet that is based on the detection result from the environment sensor, and the reference voltage Vref are input, and the first input terminal Tin1 and the second input terminal Tin2, and includes the comparator circuit CP that compares a voltage that is supplied to the first input terminal Tin1 with a voltage that is supplied to the second input terminal Tin2. During a first comparison period, the switching circuit SW supplies the detection voltage Vdet to the first input terminal Tin1, and supplies the reference voltage Vref to the second input terminal Tin2. During a second comparison period that is subsequent to the end of the first comparison period, the switching circuit SW supplies the reference voltage Vref to the first input terminal Tin1, and the detection voltage Vdet to the second input terminal Tin2. Furthermore, in a third comparison period that is subsequent to the end of the second comparison period, the switching circuit SW supplies one of the detection voltage Vdet and the reference voltage Vref to the first input terminal Tin1, and supplies the other of the detection voltage Vdet and the reference voltage Vref to the second input terminal Tin2. The period from the start of the first comparison period to the end of the second comparison period is shorter than the period from the end of the second comparison period to the start of the third comparison period.

The first to third comparison periods are periods during which the switching circuit SW supplies the reference voltage Vref and the detection voltage Vdet to the comparator circuit CP and the comparator circuit CP performs a comparison. In the example shown in FIG. 6, the first comparison period corresponds to the first period A1 in the first detection period A5, the second comparison period corresponds to the second period A2 in the first detection period A5, and the third comparison period corresponds to the first period in the second detection period A6. That is, in the example shown in FIG. 6, the period from the start of the first comparison period to the end of the second comparison period is the first detection period A5. The period from the end of the second comparison period to the start of the third comparison period is the period indicated by A4.

In the first comparison period and the second comparison period, the voltages that are supplied to the two input terminals of the comparator circuit CP are inverted. Therefore, the voltage level in the comparator circuit CP is prevented from being one-sided during the period composed of the first comparison period and the second comparison period. In contrast, the voltage level becomes one-sided when voltage is supplied during the third comparison period. In order to resolve the one-sided situation, it is necessary to provide a comparison period (a fourth comparison period) that is subsequent to the third comparison period and in which voltage is inverted. From such a viewpoint, the first comparison period and the second comparison period are periods of one unit that are closely related to each other, and the third comparison period is a period of another unit that is not closely related to the other two periods. In the present embodiment, the interval between the first comparison period and the second comparison period is set to be relatively short, and the interval between the second comparison period and the third comparison period, which is of another unit, is set to be relatively long, so that the offset prevention effect can be improved and the circuit device with a lower power consumption can be realized. That is, from such a viewpoint, it is important that the period from the start of the first comparison period to the end of the second comparison period is set to be shorter than the period from the end of the second comparison period to the start of the third comparison period, as described above.

4. Electro-optical Device

FIG. 11 is an example of a configuration of an electro-optical device 400 (a display device) that includes the circuit device 500 (in particular, the circuit device 500 that is employed in the display driver 100) according to the present embodiment. The electro-optical device 400 includes the display driver 100 and the electro-optical panel 200. The display driver 100 includes the driving circuit 10, the control circuit 30, a D/A converter circuit 40, a voltage generator circuit 50, a storage unit 60 (a memory), and the interface circuit 70. The electro-optical panel 200 includes a pixel array 210 and a sample and hold circuit 220. The pixel array 210 is an array of a plurality of pixels. The sample and hold circuit 220 is realized using a transistor, for example.

Figure 12:
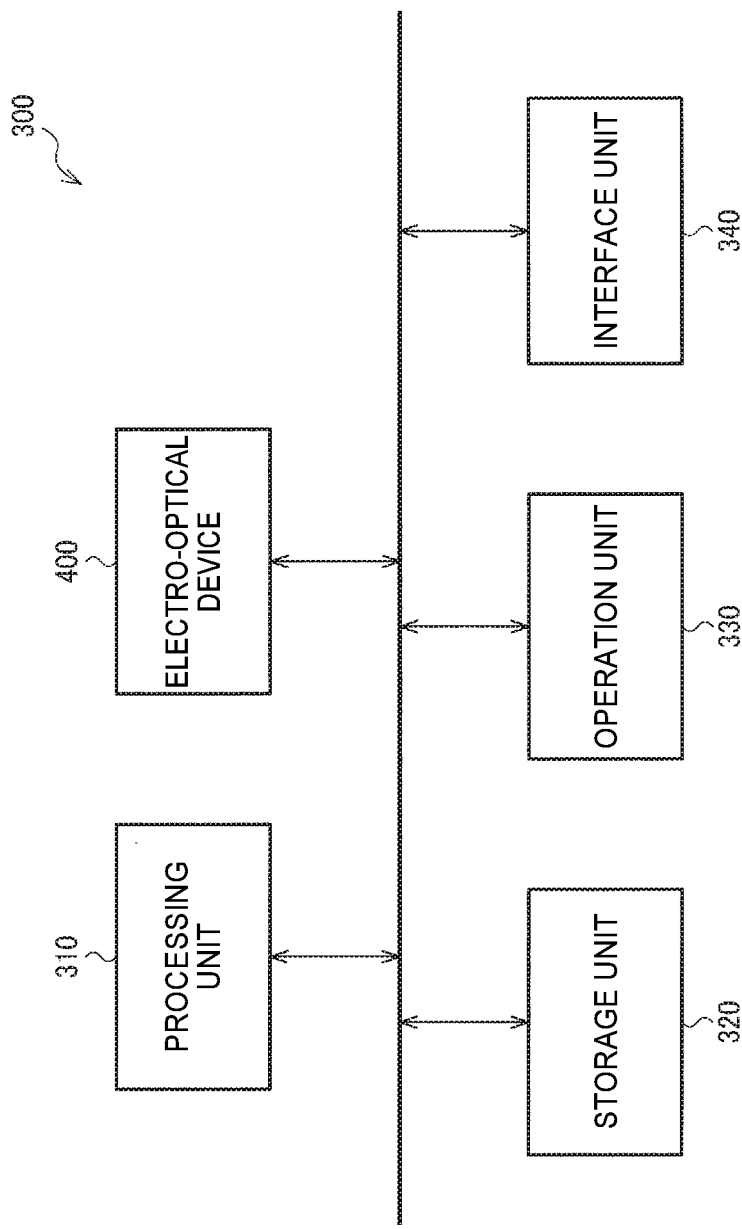
FIG. 12 is an example of a configuration of an electronic device.

The interface circuit 70 performs communication between the display driver 100 and an external processing device (e.g. the processing unit 310 in FIG. 12). For example, an external processing device inputs a clock signal and display data to the control circuit 30 via the interface circuit 70.

The control circuit 30 controls each component of the display driver 100 based on the clock signal and the display data input thereto via the interface circuit 70. For example, the control circuit 30 performs selection of a horizontal scanning line of the pixel array 210 and display timing control such as vertical synchronization control, and controls the driving circuit 10 according to the display timing.

The driving circuit 10 outputs the data signals (data voltages and gradation voltages) generated based on the display data to the electro-optical panel 200 (the sample and hold circuit 220) according to the control by the control circuit 30.

The voltage generator circuit 50 generates and outputs various kinds of voltages to the driving circuit 10 and the D/A converter circuit 40. For example, the voltage generator circuit 50 includes a gradation voltage generator circuit (e.g. a ladder resistor) that generates a plurality of voltages, a power supply circuit that generates power for an amplifier circuit of the driving circuit 10, and so on. The voltage generator circuit 50 may also include the power supply circuit 55 shown in FIG. 2.

The D/A converter circuit 40 performs D/A conversion on display data from the control circuit 30, and outputs the voltage resulting from D/A conversion to the driving circuit 10. That is, the voltage generator circuit 50 selects a voltage that corresponds to the display data from among a plurality of voltages supplied from the gradation voltage generator circuit, and outputs the selected voltage to the driving circuit 10.

The storage unit 60 stores various kinds of data (e.g. setting data) that are used to control the display driver 100. For example, the storage unit 60 is constituted by a non-volatile memory, a RAM (an SRAM or a DRAM), or the like.

The display driver 100 that includes the circuit device 500 according to the present embodiment may include an environment sensor (the temperature sensor or the detection voltage generator circuit 25). With such a configuration, it is unnecessary to provide the electro-optical panel 200 with a temperature sensor. The display driver 100 is expected to have the function of transmitting signals to an external processing device (a host), and if the environment sensor, the comparator circuit CP, and the like are provided in the display driver 100, the display driver 100 can appropriately notify the host of an environmental abnormality, for example. The display driver 100 is mounted at a position that is sufficiently close to the electro-optical panel 200 (e.g. a position on the substrate on which LEDs are mounted), and therefore it can be assumed that the temperature detected by the display driver 100 is the temperature of the electro-optical panel 200.

5. Electronic Device

FIG. 12 is an example of a configuration of the electronic device 300 that includes the circuit device 500 (in particular, the circuit device 500 that is employed in the display driver 100) according to the present embodiment. Specific examples of the electronic device 300 include various kinds of electronic devices that are equipped with a display device, such as projectors, head mounted displays, portable information terminals, on-board devices (e.g. indicator panels and car navigation systems), portable gaming terminals, and information processing devices.

The electronic device 300 includes the processing unit 310 (e.g. a processor such as a CPU, or a gate array), a storage unit 320 (e.g. a memory or a hard disk), an operation unit 330 (an operation device), an interface unit 340 (an interface circuit or an interface device), and the electro-optical device 400 (a display). As shown in FIG. 11, the electro-optical device 400 includes the display driver 100 and the electro-optical panel 200.

The operation unit 330 is a user interface that accepts various kinds of operations by the user. The operation unit 330 is, for example, a button, a mouse, a keyboard, or a touch panel or the like that is attached to the electro-optical device 400 (the electro-optical panel 200). The interface unit 340 is a data interface that receives and outputs image data and control data. The interface unit 340 is, for example, a wired communication interface such as an USB interface, or a wireless communication interface such as a wireless LAN interface. The storage unit 320 stores data input thereto from the interface unit 340. Alternatively, the storage unit 320 functions as a working memory for the processing unit 310. The processing unit 310 processes display data input thereto from the interface unit 340 or stored in the storage unit 320, and transfers the processed data to the electro-optical device 400 (the display driver 100). The electro-optical device 400 display an image on the pixel array based on the display data transferred from the processing unit 310.

While the present embodiment has been described above in detail, a person skilled in the art should easily understand that many modifications are possible without substantially departing from new matters and effects of the invention. Therefore, all of such modifications are to be embraced within the scope of the invention. For example, terms that are used at least once in the description or the drawings in conjunction with different terms having broader or similar meanings can be replaced with the different terms in any portion of the description or the drawings. Also, all of the combinations of the present embodiment and the modifications are embraced within the scope of the invention. In addition, the configurations, operations, and so on of the circuit device, the display driver, the electro-optical panel, the electro-optical device, the electronic device, and so on are not limited to those described in the present embodiment, and may be variously modified.

What is claimed is:
1. A circuit device comprising:
 a comparator circuit that has a first input terminal and a second input terminal, and compares a voltage that is supplied to the first input terminal with a voltage that is supplied to the second input terminal; and
 a switching circuit to which a detection voltage that is based on a result of detection from an environment sensor, and a reference voltage, are input,
 wherein the switching circuit supplies the detection voltage to the first input terminal of the comparator circuit and the reference voltage to the second input terminal of the comparator circuit during a first period out of a detection period, and supplies the reference voltage to the first input terminal and the detection voltage to the second input terminal during a second period out of the detection period, and
 TB>TA is satisfied, where TA denotes a duration of the detection period, and TB denotes a duration of a period from an end of a first detection period, which is the detection period, to a start of a second detection period, which is a detection period that is subsequent to and consecutive to the first detection period.

2. The circuit device according to claim 1,
 wherein the comparator circuit is set to be in an inactive state or a low power consumption state during a third period between the first period and the second period, the low power consumption state being a state in which power consumption is lower than power consumption in the first period and the second period.

3. An electronic device comprising the circuit device according to claim 2.

4. The circuit device according to claim 1,
 wherein the switching circuit is set to be in a non-selected state during a third period between the first period and the second period, the non-selected state being a state in which the first input terminal and the second input terminal are not supplied with the detection voltage or the reference voltage.

5. An electronic device comprising the circuit device according to claim 4.

6. The circuit device according to claim 1,
wherein the comparator circuit is set to be in an inactive state or a low power consumption state during an intermediate period that is the period from the end of the first detection period to the start of the second detection period, the low power consumption state being a state in which power consumption is lower than power consumption in the first period and the second period.

7. An electronic device comprising the circuit device according to claim 6.

8. The circuit device according to claim 1,
wherein the switching circuit is set to be in a non-selected state during an intermediate period that is the period from the end of the first detection period to the start of the second detection period, the non-selected state being a state in which the first input terminal and the second input terminal are not supplied with the detection voltage or the reference voltage.

9. An electronic device comprising the circuit device according to claim 8.

10. The circuit device according to claim 1,
wherein the comparator circuit is set to be
in an active state during the first period and the second period, and
in an inactive state or a low power consumption state during a period other than the first period or the second period, the low power consumption state being a state in which power consumption is lower than power consumption in the first period and the second period.

11. The circuit device according to claim 1, further comprising:
an output circuit that outputs a result of comparison by the comparator circuit,
wherein the output circuit outputs the result of comparison obtained in one of the first period and the second period.

12. The circuit device according to claim 11,
wherein if the second period is set to be subsequent to the first period in the detection period, the output circuit outputs the result of comparison obtained in the second period.

13. The circuit device according to claim 1,
wherein a duration of the first period is equal to a duration of the second period.

14. The circuit device according to claim 1,
wherein TB>2×TA is satisfied, where TA denotes the duration of the detection period and TB denotes the duration of the period from the end of the first detection period to the start of the second detection period.

15. The circuit device according to claim 1, further comprising:
a driving circuit that drives an electro-optical panel,
wherein the detection period is set based on a vertical synchronization signal that is used to drive the electro-optical panel, or an external command.

16. An electro-optical device comprising:
the circuit device according to claim 15; and
the electro-optical panel.

17. The circuit device according to claim 15,
wherein the first period and the second period are set based on a pixel clock signal that is used to drive the electro-optical panel.

18. An electro-optical device comprising:
the circuit device according to claim 17; and
the electro-optical panel.

19. An electronic device comprising the circuit device according to claim 1.

20. A circuit device comprising:
a switching circuit to which a detection voltage that is based on a result of detection from an environment sensor, and a reference voltage, are input; and
a comparator circuit that has a first input terminal and a second input terminal, and compares a voltage that is supplied to the first input terminal with a voltage that is supplied to the second input terminal,
wherein the switching circuit
supplies the detection voltage to the first input terminal and the reference voltage to the second input terminal during a first comparison period,
supplies the reference voltage to the first input terminal and the detection voltage to the second input terminal during a second comparison period that is subsequent to an end of the first comparison period and consecutive to the first comparison period,
supplies one of the detection voltage and the reference voltage to the first input terminal and the other of the detection voltage and the reference voltage to the second input terminal during a third comparison period that is subsequent to an end of the second comparison period, and consecutive to the second comparison period, and
a period from a start of the first comparison period to the end of the second comparison period is shorter than a period from the end of the second comparison period to a start of the third comparison period.

* * * * *